(12) United States Patent
Joshi et al.

(10) Patent No.: US 7,556,088 B2
(45) Date of Patent: Jul. 7, 2009

(54) THERMOSIPHON FOR LAPTOP COMPUTER

(75) Inventors: Shrikant Mukund Joshi, Williamsville, NY (US); Mohinder Singh Bhatti, Amherst, NY (US); Ilya Reyzin, Williamsville, NY (US)

(73) Assignee: Coolit Systems, Inc., Calgary AB (CA)

( * ) Notice: Subject to any disclaimer, the term of this patent is extended or adjusted under 35 U.S.C. 154(b) by 0 days.

(21) Appl. No.: 11/731,202

(22) Filed: Mar. 30, 2007

(65) Prior Publication Data

US 2008/0236788 A1 Oct. 2, 2008

(51) Int. Cl.
*F28F 7/00* (2006.01)
*H05K 7/20* (2006.01)

(52) U.S. Cl. .................... 165/80.3; 165/104.21

(58) Field of Classification Search ............. 165/80.4, 165/104.21, 104.33, 104.34, 108, 80.3, 185; 361/699, 700
See application file for complete search history.

(56) References Cited

U.S. PATENT DOCUMENTS

| | | | |
|---|---|---|---|
| 6,315,033 B1 * | 11/2001 | Li .......................... | 165/104.33 |
| 6,439,298 B1 * | 8/2002 | Li .......................... | 165/104.33 |
| 7,147,045 B2 * | 12/2006 | Quisenberry et al. .... | 165/104.33 |
| 7,317,616 B2 * | 1/2008 | Li .............................. | 361/700 |
| 2003/0111217 A1 * | 6/2003 | Li .............................. | 165/185 |
| 2003/0173061 A1 * | 9/2003 | Lai et al. .................. | 165/80.4 |
| 2004/0026067 A1 * | 2/2004 | Mochizuki et al. ............ | 165/10 |
| 2004/0070941 A1 * | 4/2004 | Ghosh et al. ................ | 361/700 |
| 2006/0120050 A1 * | 6/2006 | Chen et al. .................. | 361/700 |
| 2006/0162900 A1 * | 7/2006 | Huang et al. ................ | 165/80.4 |
| 2007/0151712 A1 * | 7/2007 | Foster et al. .......... | 165/104.33 |

* cited by examiner

*Primary Examiner*—Tho v Duong
(74) *Attorney, Agent, or Firm*—Arent Fox LLP

(57) ABSTRACT

A heat exchanger assembly for cooling an electronic element includes an oblong condensing tube extending between ends to define an upper chamber downwardly bowed through an upwardly extending arc and a lower chamber upwardly bowed through a downwardly extending arc for dissipating heat. A continuous sheet extends in v-shaped fins between and engaging said arcs of said chambers. The internal fins extend from a center axis of the tube to reverse bends defining the opposite ends of the tube. A continuous sheet extending in sinuous corrugations extends around the exterior of the endless loop between opposite sides of a heat transfer area, which receives the electronic element.

10 Claims, 1 Drawing Sheet

THERMOSIPHON FOR LAPTOP COMPUTER

BACKGROUND OF THE INVENTION

1. Field of the Invention

This invention relates to a heat exchanger assembly for cooling an electronic element.

2. Description of the Prior Art

The operating speed of computers is constantly being improved to create faster computers. With this, comes an increase in heat generation and a need to effectively dissipate that heat.

Heat exchangers and heat sink assemblies have been used that apply natural or forced convection cooling methods to dissipate heat from electronic elements that are highly concentrated heat sources such as microprocessors and computer chips; however, air has a relatively low heat capacity. Thus, liquid-cooled units called LCUs employing a cold plate in conjunction with high heat capacity fluids have been used to remove heat from these types of heat sources. Although, LCUs are satisfactory for moderate heat flux, increasing computing speeds have required more effective heat sink assemblies.

Thermosiphon cooling units (TCUs) have been used for cooling electronic elements having a high heat flux. A typical TCU absorbs heat generated by the electronic element by vaporizing a working fluid housed on the boiler plate of the unit. The boiling of the working fluid constitutes a phase change from liquid-to-vapor state and as such the working fluid of the TCU is considered to be a two-phase fluid. Vapor generated during boiling of the working fluid is then transferred to a condenser, where it is liquefied by the process of film condensation over the condensing surface of the TCU. The heat is rejected into ambient air flowing over the condenser and fins are commonly employed on the condenser to increase the heat transferred from the vapor. The condensed liquid is returned back to the boiler plate by gravity.

An example of such a TCU includes U.S. Pat. No. 5,529,115 to Paterson. The Paterson patent discloses a heat exchanger assembly including a container defining a circular chamber extending in an endless loop and partially filled with a coolant which forms a coolant pool in the lower portion of the chamber. Heat generated by an integrated circuit device causes the coolant to boil and vaporized coolant rises upwardly from the coolant pool around the circular chamber to an upper portion of the chamber. As the coolant rises to the upper portion of the chamber, it condenses and flows to the coolant pool in the lower portion of the chamber.

The circular chamber in Paterson '115 patent includes internal cooling fins spaced from one another about the interior of the chamber. However, a large volume of cooling air flows through the circular chamber without performing any heat transfer.

Space or volume is at a premium in computer environments and it is essential that thermosiphon cooling units maximize heat transfer while minimizing the space occupied. In addition to minimizing space, it is desirable that TCUs be relatively inexpensive to fabricate. Furthermore, as computer processing speeds continue to increase, it is desirable for TCUs to provide more efficient heat dissipation. The cost to fabricate a TCU is relatively high when the TCU is fabricated from especially dedicated and unique components, as distinguished from being fabricated from stock materials.

SUMMARY OF THE INVENTION AND ADVANTAGES

The invention provides a heat exchanger assembly for cooling an electronic element comprising a condensing tube extending in an endless loop defining upper and lower chambers with a plurality of internal fins for dissipating heat extending between and engaging the upper and lower chambers of the tube.

Accordingly, the invention provides an alternative design for a thermosiphon that occupies a minimum of space yet efficiently dissipates heat and can be manufactured from stock parts, or efficiently formed parts. The condensing tube can be extruded tubing cut to the desired length and bent into an endless loop. The internal fins are formed in a continuous and inexpensive process to fill the space defined by the upper and lower chambers of the condensing tube.

BRIEF DESCRIPTION OF THE DRAWINGS

Other advantages of the present invention will be readily appreciated, as the same becomes better understood by reference to the following detailed description when considered in connection with the accompanying drawing showing a preferred embodiment of the invention in perspective and exploded.

DETAILED DESCRIPTION OF THE INVENTION

Figure 1:
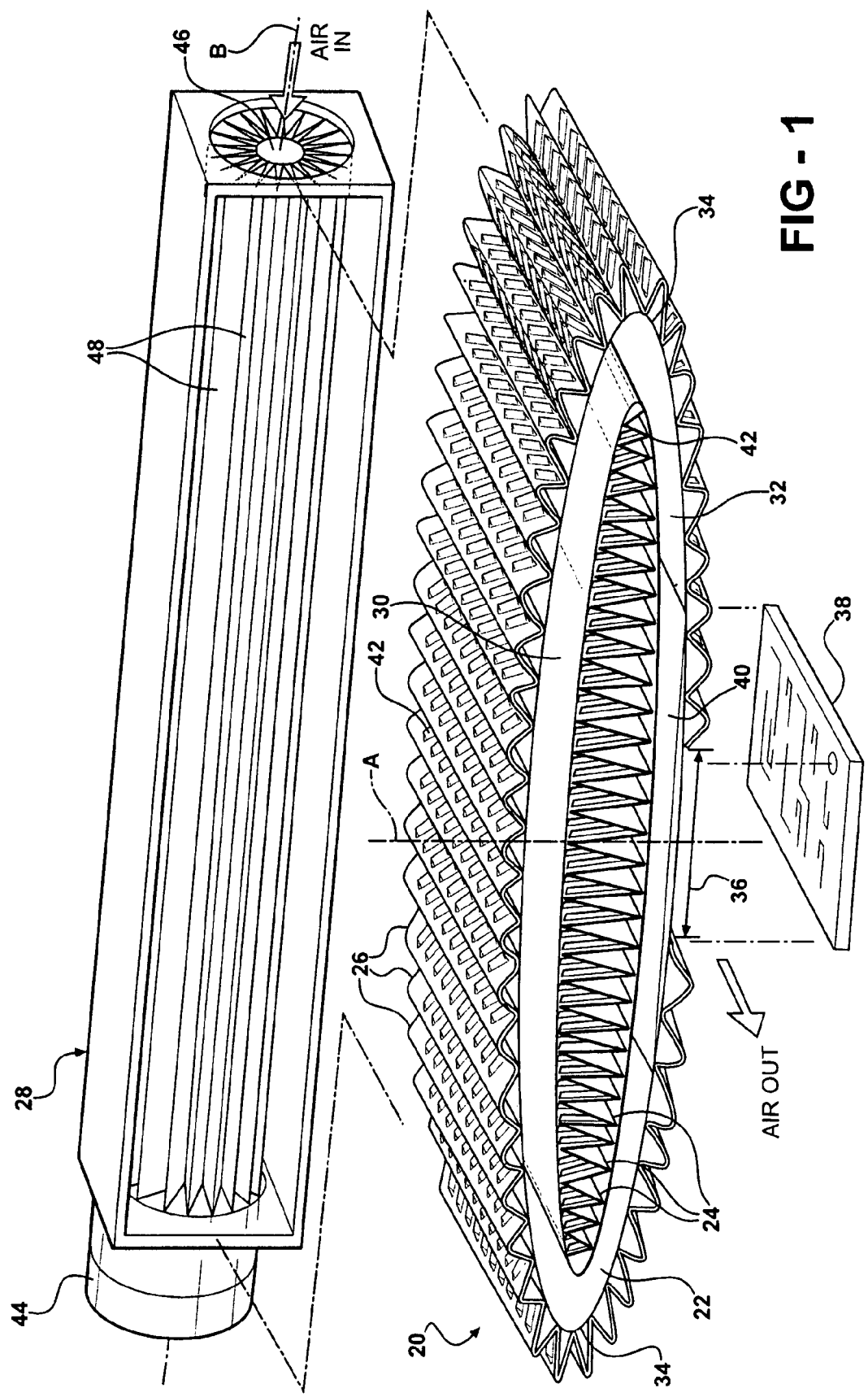

Referring to the Figure, a heat exchanger assembly 20 is generally shown for cooling an electronic element.

The assembly 20 includes a condensing tube 22 generally indicated extending in an endless loop. A plurality of internal fins 24 extend within the endless loop of the tube 22 for dissipating heat. A plurality of corrugated external fins 26 extend around the outside of the condensing tube 22, also for dissipating heat. A cross-flow fan assembly 28 generally indicated may be supported adjacent to the tube 22 for moving ambient air through the internal fins 24 and the external fins 26. Persons skilled in the art will appreciate that an axial fan may be used instead of the indicated cross-flow fan assembly 28 to move ambient air through the internal and external fins 24, 26.

The endless loop of the condensing tube 22 defines an oblong shape having an upper chamber 30 and a lower chamber 32 extending from a center axis A to reverse bends defining opposite ends 34 of the oblong tube 22. The lower chamber 32 of the tube 22 is upwardly bowed through a downwardly extending arc between the opposite ends 34, and the upper chamber 30 of the tube 22 is downwardly bowed through an upwardly extending arc between the ends 34. The distance between the upper and lower chambers 30, 32 increases from each of the ends 34 toward the center axis A. In the preferred embodiment of the invention, the ratio of the distance along the center axis A to the distance between the ends 34 is at least one to five.

The internal v-shaped fins 24 of varying height are fabricated from a continuous sheet extending from ends toward the center axis with progressively increasing height so as to engage the chambers of the oblong tube 22. This provides efficient dissipation of heat within the tube 22. The oblong shape of the tube 22 minimizes the need for heat transfer at the opposite ends 34 of the tube 22 where the condensate within the tube 22 around the ends 34 has the least heat differential along the internal fins 24 between the upper and lower chambers 30, 32. The internal fins 24, which extend within the endless loop of the tube 22 are thus shorter at the opposite ends 34 of the tube 22 and get longer as they approach center axis A of the tube 22.

The lower chamber 32 presents an outwardly facing flat surface 36 for receiving a heat generating element 38, such as an integrated circuit. The lower chamber 32 also houses a working fluid 40. The outwardly facing surface 36 is flattened so that the heat generating element 38 can be affixed to it with least thermal resistance. The heat generating element 38 is positioned such that it will engage the tube 22 beneath and centered on the center axis A of the tube 22 and of the assembly 20. As described above, the internal fins 24 at the center axis A of the tube 22 are the longest, and thus provide the highest amount of heat dissipation. Each of the internal fins 24 also includes louvers 42, which operate to increase the heat transfer coefficient on the air side by interrupting the thermal boundary layer formed on the internal fins 24.

The external fins 26 are fabricated from a continuous sheet in sinuous corrugations extending around the endless loop of the tube 22 between opposite sides of the flattened surface 36. The corrugations are of a constant and equal depth between oppositely extending crests all the way around the tube 22. The external fins 26 are also corrugated, each including vertical louvers 42 that are perpendicular to the direction in which air is discharged from the heat exchanger assembly 20. The louvers 42 on the external fins 26 enhance the heat transfer coefficient, and thus, the heat transfer rate by interrupting the thermal boundary layers formed on the external fins 26.

The amount of heat transfer is the product of the heat transfer coefficient and the heat transfer area. Thus, the greater heat transfer area, the greater the amount of heat transfer. In the interior of the tube 22 the heat transfer coefficient of boiling refrigerant and condensing refrigerant vapor is inherently high. Hence, there is no need to enhance the heat transfer area on the interior of the tube. However, on the exterior of the tube 22 the heat transfer coefficient of air is inherently low and there is need to augment the heat transfer area on the air side. This is done through the addition of internal fins 24 and external fins 26.

The cross-flow fan assembly 28 includes a fan axis B extending transverse to the center axis A of the heat exchanger assembly 20. A fan motor 44 is disposed along the fan axis B and a hub 46 is operatively connected to the fan motor 44. The hub 46 extends along the fan axis B from the fan motor 44 to a distal end. A plurality of fan blades 48 are disposed about the hub 46 and extend radially from and axially along the hub 46 between the fan motor 44 and the distal end. Ambient air enters the fan assembly 28 axially, and is discharged in a direction normal to the fan axis B as the fan blades spin. The length of the fan assembly 28 is the same as the width of the heat exchange assembly 20.

In operation, heat generated by heat generating element 38 affixed to the base of endless loop of the condensing tube 22 causes the working fluid in liquid state in the condensing tube 22 to boil. Boiling of the working fluid 40 generates a vapor that flows upward on both sides of the condensing tube 22 and condenses on the internal walls of the tube 22 due to heat absorption by the internal and external fins 24, 26. The heat is rejected into ambient air flowing over the condensing tube 22 and the internal and external fins 24, 26. The working fluid 40 in the form of condensed liquid is returned to the flattened surface 36 by the force of gravity.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A heat exchanger assembly for cooling an electronic element comprising;
   a condensing tube defining a lower chamber for transferring heat from an electronic element to a working fluid to boil the working fluid and an upper chamber for transferring heat from the working fluid to the ambient air to condense the working fluid,
   said lower chamber extending between opposite ends and said upper chamber extending between and in fluid communication with said opposite ends of said lower chamber to define an endless loop,
   a plurality of internal fins extending within the endless loop of said tube for dissipating heat to the ambient air, and
   said internal fins presenting a plurality of V-shapes as viewed in cross-section with each fin extending transversly between and engaging both of said upper and lower chambers of said condensing tube whereby each fin transfers heat from the lower chamber to the upper chamber, and
   wherein said endless loop of said tube defines an oblong cross section extending from a center axis to reverse bends defining opposite ends, and
   wherein the axial length of the internal fins at the center axis is greater than the axial length of the internal fins at said ends.

2. A heat exchanger assembly as set forth in claim 1 wherein said lower chamber of said tube is upwardly bowed through a downwardly extending arc between said ends and said upper chamber of said tube is downwardly bowed through an upwardly extending arc between said ends with the distance between said chambers increasing from each of said ends toward said center axis.

3. A heat exchanger assembly as set forth in claim 2 wherein the ratio of the distance between said chambers along said center axis to the distance between said ends is one to five.

4. A heat exchanger assembly as set forth in claim 3 wherein said internal fins are defined by a continuous sheet extending through v-shaped fins.

5. A heat exchanger assembly as set forth in claim 4 wherein said v-shaped fins progressively extend a greater axial distance from said ends to said center axis.

6. A heat exchanger assembly as set forth in claim 1 wherein said lower chamber presents an outwardly facing heat transfer area for receiving a heat generating element.

7. A heat exchanger assembly as set forth in claim 6 further comprising a plurality of corrugated external fins extending around said endless loop between opposite sides of said heat transfer area.

8. A heat exchanger assembly as set forth in claim 7 wherein said external fins are defined by a continuous sheet in sinuous corrugations.

9. A heat exchanger assembly as set forth in claim 8 further comprising a fan assembly supported adjacent to said tube for moving ambient air through said internal fins and said external fins.

10. A heat exchanger assembly for cooling an electronic element comprising;
- a condensing tube defining a lower chamber for transferring heat from an electronic element to a working fluid to boil the working fluid and an upper chamber for transferring heat from the working fluid to the ambient air to condense the working fluid,
- said lower chamber extending between opposite ends and said upper chamber extending between and in fluid communication with said opposite ends of said lower chamber to define an endless loop,
- a plurality of internal fins extending within the endless loop of said tube for dissipating heat,
- a plurality of corrugated external fins extending around said tube for dissipating heat,
- a fan assembly supported adjacent to said tube for moving ambient air through said internal fins and said external fins for cooling, and
- said endless loop of said tube defining an oblong cross section,
- said upper chamber and said lower chamber extending from a center axis to reverse bends at said opposite ends with said lower chamber of said tube being upwardly bowed through a downwardly extending arc between said ends and with said upper chamber of said tube being downwardly bowed through an upwardly extending arc between said ends with the distance between said chambers increasing from each of said ends toward said center axis and the ratio of the distance between said chambers along said center axis to the distance between said ends being one to five,
- said internal fins presenting a plurality of v-shapes as viewed in cross-section with each fin extending transversly between and engaging both of said upper and lower chambers of said condensing tube whereby each fin transfers heat from the lower chamber to the upper chamber,
- said internal fins defined by a continuous sheet extending in v-shaped fins between and engaging said chambers of said tube for dissipating heat,
- said v-shaped fins progressively extending a greater axial distance from said ends to said center axis, wherein the axial distance of the internal fins at the center axis is greater than the axial distance of the internal fins at said ends,
- said lower chamber presenting an outwardly facing heat transfer area for receiving a heat generating element, and
- said external fins defined by a continuous sheet in sinuous corrugations extending around the exterior of said endless loop of said tube between opposite sides of said heat transfer area.

\* \* \* \* \*